United States Patent
Moteki et al.

(10) Patent No.: US 7,999,249 B2
(45) Date of Patent: Aug. 16, 2011

(54) NITRIDE SEMICONDUCTOR LIGHT EMITTING DEVICE WITH SURFACE TEXTURE AND ITS MANUFACTURE

(75) Inventors: Masahiko Moteki, Yokohama (JP); Satoshi Tanaka, Yokohama (JP); Yusuke Yokobayashi, Yokohama (JP)

(73) Assignee: Stanley Electric Co., Ltd., Tokyo (JP)

( * ) Notice: Subject to any disclaimer, the term of this patent is extended or adjusted under 35 U.S.C. 154(b) by 253 days.

(21) Appl. No.: 12/500,155

(22) Filed: Jul. 9, 2009

(65) Prior Publication Data
US 2010/0006876 A1    Jan. 14, 2010

(30) Foreign Application Priority Data
Jul. 10, 2008    (JP) .................... 2008-180656

(51) Int. Cl.
    *H01L 29/06*    (2006.01)
(52) U.S. Cl. ............ 257/12; 438/46; 257/E25.028; 257/E33.03
(58) Field of Classification Search .......... 257/12, 257/13, 79, 95, E25.028, E25.032, E33.03; 438/22, 46, 47, 481
See application file for complete search history.

(56) References Cited

U.S. PATENT DOCUMENTS
6,495,862 B1    12/2002    Okazaki et al.
7,244,957 B2 *   7/2007    Nakajo et al. ............... 257/13

FOREIGN PATENT DOCUMENTS
JP    3469484 B2    9/2003
* cited by examiner

*Primary Examiner* — Quoc D Hoang
(74) *Attorney, Agent, or Firm* — Chen Yoshimura LLP

(57) ABSTRACT

A nitride semiconductor light emitting device includes: a substrate for growing nitride semiconductor of a hexagonal crystal structure; a first nitride semiconductor layer of a first conductivity type formed above the substrate; an active layer formed on the first nitride semiconductor layer for emitting light when current flows; a second nitride semiconductor layer of a second conductivity type opposite to the first conductivity type formed on the active layer; texture formed above at least a partial area of the second nitride semiconductor layer and having a plurality of protrusions of a pyramid shape, each of the protrusions including a lower layer made of nitride semiconductor doped with impurities of the second conductivity type and an upper layer made of nitride semiconductor not intentionally doped with impurities; and a transparent electrode covering surfaces of the second nitride semiconductor layer and the texture.

20 Claims, 6 Drawing Sheets

NITRIDE SEMICONDUCTOR LIGHT EMITTING DEVICE WITH SURFACE TEXTURE AND ITS MANUFACTURE

CROSS-REFERENCE TO RELATED APPLICATIONS

This application is based upon and claims the benefit of priority of the Japanese Patent Application No. 2008-180656, filed on Jul. 10, 2008, the entire contents of which are incorporated herein by reference.

BACKGROUND

1. Field

The present invention relates to a semiconductor light emitting device and its manufacture method, and more particularly to a nitride semiconductor light emitting device and its manufacture method.

2. Related Art

External emission efficiency of a nitride semiconductor light emitting device is desired to be further improved. Description will be made by using a typical nitride semiconductor light emitting device as an example. On a transparent substrate such as sapphire, a GaN buffer layer grown at a low temperature, an n-type GaN layer, an emission layer and a p-type GaN layer are grown and laminated in this order by metal organic chemical vapor deposition (MOCVD) or the like. Band gap of GaInN formed by replacing a portion of Ga of GaN with In becomes narrower than that of GaN, whereas band gap of GaAlN formed by replacing a portion of Ga of GaN with Al becomes broader than that of GaN. AlN may be epitaxially grown on GaN. $Al_xIn_yGaN$ ($0 \leq x \leq 1$, $0 \leq y \leq 1$, $0 < z \leq 1$, $x+y+z=1$) is called nitride semiconductor. It is possible to adjust the characteristics of a semiconductor light emitting device, by selecting compositions of AlGaInN.

Emission in an emission layer is omnidirectional. Light propagating toward a flat surface and reaching at an incidence angle of a critical angle or larger is totally reflected at the surface. It is not easy to externally emit light once totally reflected at the surface. It is known that if texture (irregularity) is formed on the surface, it becomes possible to improve an external emission efficiency.

Japanese Patent Publication No. 3469484 proposes a method of processing the surface of a p-type nitride semiconductor layer by dry etching or ion milling to form texture (irregularity).

There is a possibility that dry etching or ion milling may damage a processed layer and increase contact resistance. Development is being made to further improve external emission efficiency.

SUMMARY OF THE INVENTION

It is an object of the present invention to provide a nitride semiconductor light emitting device with an improved external emission efficiency and a method for manufacturing a nitride semiconductor light emitting device.

According to one aspect of the present invention, there is provided a nitride semiconductor light emitting device comprising:

a substrate for growing nitride semiconductor of a hexagonal crystal structure;

a first nitride semiconductor layer of a first conductivity type formed above the substrate;

an active layer formed on the first nitride semiconductor layer for emitting light when current flows;

a second nitride semiconductor layer of a second conductivity type opposite to the first conductivity type, formed on the active layer;

texture formed above at least a partial area of the second nitride semiconductor layer and having a plurality of protrusions of a pyramid shape, each of the protrusions including a lower layer made of nitride semiconductor doped with impurities of the second conductivity type and an upper layer made of nitride semiconductor not intentionally doped with impurities; and a transparent electrode covering surfaces of the second nitride semiconductor layer and the texture.

DESCRIPTION OF THE PREFERRED EMBODIMENTS

The present inventors have studied improvement of external emission efficiency of a semiconductor light emitting device by forming texture on the device surface. It is expected that in order not to influence an emission mechanism, it is preferable to improve external emission efficiency by forming an additional structure without changing the structure of a light emitting device. An additional structure capable of reducing total reflection is desired. It is desired that emission efficiency itself will not be lowered even if an additional structure is provided. The present inventors propose that by following these fundamental policies, surface texture capable of improving external emission efficiency is grown on the emission structure.

Figure 1A:
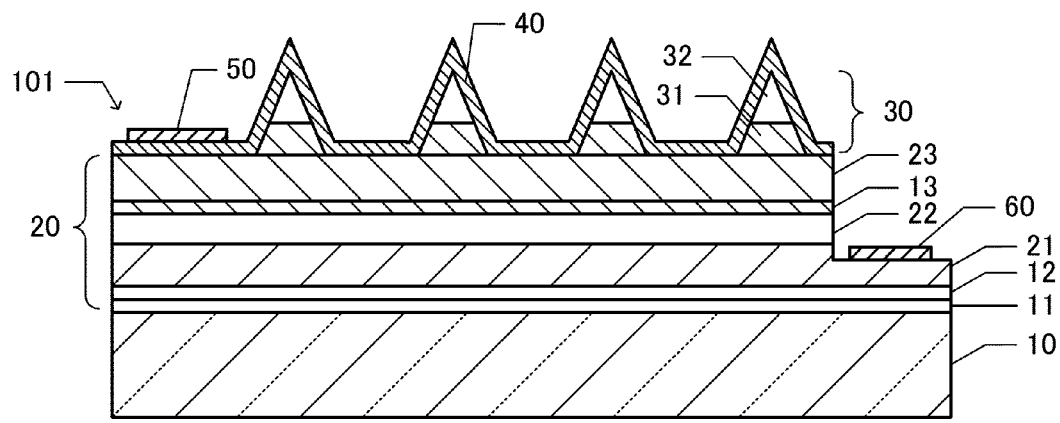
FIGS. 1A and 1B are schematic cross sectional views illustrating the structure of a nitride semiconductor light emitting device and the function of texture.

FIG. 1A is a schematic cross sectional view illustrating the structure of a nitride semiconductor light emitting device 101. On the +c-plane of a c-plane sapphire substrate 10, a nitride semiconductor buffer layer 11 and a nitride semiconductor underlying layer 12 are grown, and then an n-type nitride semiconductor layer 21, a nitride semiconductor active layer 22, a p-type nitride semiconductor barrier layer 13, and a p-type nitride semiconductor layer 23 (the layers 21 to 23 may be called collectively a semiconductor laminate 20) are grown to form a fundamental semiconductor emission structure. On the p-type nitride semiconductor layer 23, nitride semiconductor texture 30 is grown including a plurality of protrusions of a six-sided pyramid shape each having a lower layer 31 and an upper layer 32. A transparent electrode 40 is formed covering the p-type nitride semiconductor layer 23 and the nitride semiconductor texture 30, and a p-side electrode 50 is formed on a partial area of the transparent electrode 40. A partial area of the n-type nitride semiconductor layer 21 is exposed by etching, and an n-side electrode 60 is formed on this area.

Nitride semiconductor is made of $Al_xIn_yGa_zN$ ($0 \leq x \leq 1$, $0 \leq y \leq 1$, $0 \leq z \leq 1$, $x+y+z=1$) having a crystal structure of hexagonal symmetry. The buffer layer 11 is, for example, a GaN layer grown at a low temperature and crystallized through high temperature anneal. The buffer layer 11 and underlying layer 12 are auxiliary constituent elements to be used for crystal growth of the semiconductor light emitting device, are not positive constituent elements, and non-doped. The n-type layer 21 is, for example, an Si-doped n-type GaN layer. The active layer 22 is an emission region of a multiple quantum well constituted of a GaN/GaN repetitive multilayer. The emission layer may also be formed by a double hetero structure such as GaN/InGaN/GaN or a non-doped InGaN layer. The clad layer 13 is a wide gap layer providing the active layer with a carrier/light confinement effect, and, for example, a p-type AlGaN layer. The p-type layer 23 has preferably low resistance, and is, for example, an Mg-doped p-type GaN layer.

Each protrusion of the texture 30 has a six-sided pyramid shape originating from the crystal structure of $Al_xIn_yGa_zN$, and is constituted of, e.g., an Mg-doped p-type GaN lower layer 31 and a non-doped GaN upper layer 32. The texture 30 has a function of improving external emission efficiency. The transparent electrode 40 is, for example, an ITO layer. The p-side pad-electrode 50 is, for example, a TiAu layer. The n-side electrode 60 is, for example, a TiAl layer.

Figure 1B:
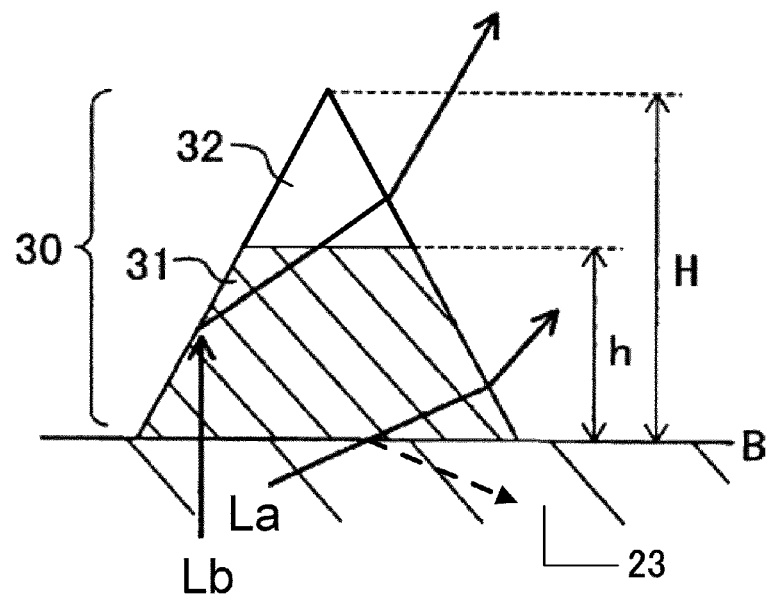

As illustrated in FIG. 1B, if a protrusion of the texture 30 does not exist, light La reaching the surface B of the p-type layer 23 at an incidence angle of a critical angle or larger is totally reflected and returns into the p-type layer 23, whereas if the lower layer 31 of a protrusion of the texture 30 exists on the p-type layer 23, the surface B has no optical interface so that light La propagates straightforward through the lower layer 31 and outputs from the side wall of the protrusion of the texture 30. By allowing light otherwise to be totally reflected to be externally output, it becomes possible to improve external emission efficiency. Even if light Lb is totally reflected at the side wall of the protrusion of the texture 30, light Lb is allowed to be externally output if an incidence angle at the next incidence side wall is smaller than a critical angle. External emission efficiency of the light emitting device 101 is improved as a whole.

Although a thickness of the semiconductor laminate 20 is drawn exaggerated in the drawings, a height of a protrusion of the texture 30 is considerably thicker than that of the p-type layer 23. Contact area between the transparent electrode 40 and p-type layer 23 is reduced corresponding in amount to the area covered with the texture 30. If the texture 30 is all made of non-doped GaN, sufficient current injection into the active layer 22 becomes difficult. If the texture 30 is all made of Mg-doped p-type GaN, light absorption therein by the dopant becomes large and external emission efficiency lowers. With usual vapor deposition, a dopant concentration becomes higher at the position near the distal end (apex) portion, and light absorption increases. A non-doped distal end portion of each protrusion of the texture is better from this reason. It is therefore preferable that each protrusion of the texture 30 has a structure having a doped lower layer 31 and a non-doped upper layer 32.

Figure 2A:
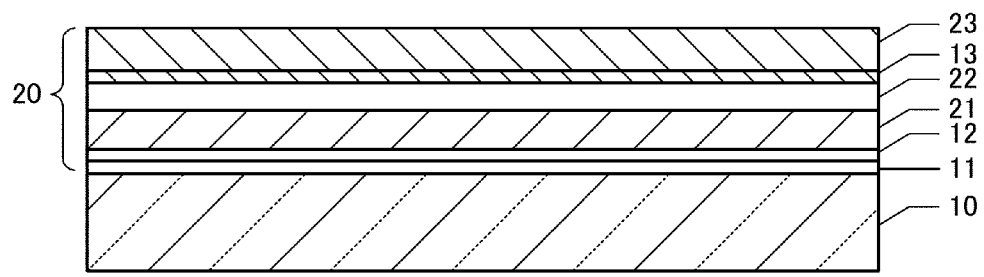
FIGS. 2A to 2H are schematic cross sectional views illustrating main processes of a method for manufacturing a nitride semiconductor light emitting device and a plan view illustrating an example of a mask.

With reference to FIGS. 2A to 2F, description will be made on main processes of a method for manufacturing the nitride semiconductor light emitting device 101. As illustrated in FIG. 2A, a c-plane sapphire substrate 10 is prepared and loaded in an MOCVD system with the +c-plane directed upward, and thermal cleaning is performed for 10 minutes in hydrogen atmosphere. A GaN buffer layer 11 is grown at a low temperature by MOCVD, by supplying trimethylgallium (TMG): 10.4 µmol/min and ammonia ($NH_3$): 3.3 LM(LM indicates liter/min at 25 degrees centigrade and 1 atm) for 3 minutes at a substrate temperature of 500° C. This buffer layer grown at a low temperature is annealed for 30 seconds at 1000° C. to crystallize it. It is possible to obtain a crystal layer of better crystallinity by the low temperature growth and the high temperature annealing than simple high temperature crystal growth at an initial stage of growing a crystal layer on a mis-matched substrate having a different lattice constant.

A non-doped GaN underlying layer 12 is grown by MOCVD, by supplying TMG: 45 µmol/min and $NH_3$: 4.4 LM for 60 minutes at a substrate temperature of 1000° C. A film thickness is about 3 µm. In this manner, an underlying surface is obtained having good crystallinity suitable for epitaxial growth of the nitride semiconductor light emission structure. An Si-doped n-type GaN layer 21 is grown by MOCVD, by supplying TMG: 45 µmol/min, $SiH_4$: 2.7 µmol/min, and $NH_3$: 4.4 LM for 60 minutes at a substrate temperature of 1000° C. A film thickness is about 3 µm, and a carrier concentration is about $5 \times 10^{18}$ $cm^{-3}$. An active layer 22 is grown on the n-type layer 21.

Figure 2B:
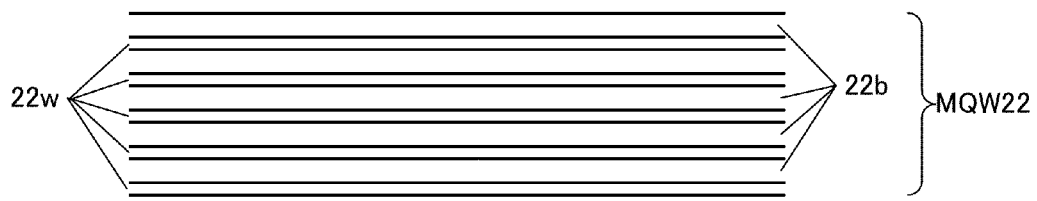

As illustrated in FIG. 2B, a multiple quantum well (MQW) 22 made of an InGaN/GaN repetitive multilayer film is grown. An InGaN layer forms a well layer 22w having a narrow band gap, and a GaN layer forms a barrier layer 22b having a broad band gap. Letting one pair of InGaN/GaN be one cycle, for example, five cycles of InGaN/GaN are grown. Emission wavelength depends not only on a composition of the well layer 22w, but also on compositions and thicknesses of the whole MQW. It is preferable to set a substrate temperature low during MQW growth in order to improve film thickness control precision.

For example, an InGaN well layer 22w having a thickness of about 2.2 nm is grown by supplying trimethylindium TMI: 10 µmol/min and $NH_3$: 4.4 LM for 33 seconds at a substrate temperature of, e.g., 700° C. Next, by maintaining the substrate temperature at 700° C., a GaN barrier layer 22b having a film thickness of about 15 nm is grown by supplying TMG: 3.6 µmol/min and $NH_3$: 4.4 LM for 320 seconds. The same crystal growth is repeated five cycles to complete the MQW active layer 22.

Reverting to FIG. 2A, an Mg-doped p-type AlGaN clad layer 13 is grown on the active layer 22 by MOCVD, by supplying TMG: 8.1 µmol/min, trimethylaluminum TMA: 7.5 µmol/min, biscyclopentadienyl magnesium CP2Mg: $2.9 \times 10^{-7}$ µmol/min, and $NH_3$: 4.4 LM for 5 minutes at a substrate temperature of 870° C. A film thickness is about 40 nm. The carrier/light confinement effect is enhanced by forming the AlGaN layer having a band gap broader than that of the active layer material of InGaN and GaN, sufficiently thick. However, the clad layer 13 is not an essential constituent element because the light emitting device is realized if a pin junction or pn junction is formed.

An Mg-doped p-type GaN layer 23 is grown on the clad layer 13 by MOCVD by supplying TMG: 18 µmol/min, CP2Mg: $2.7 \times 10^{-7}$ µmol/min, and $NH_3$: 4.4 LM for 7 minutes at a substrate temperature of 870° C. A film thickness is about 150 nm, and a carrier concentration is about $1 \times 10^{18}$ $cm^{-3}$.

Figure 2C:
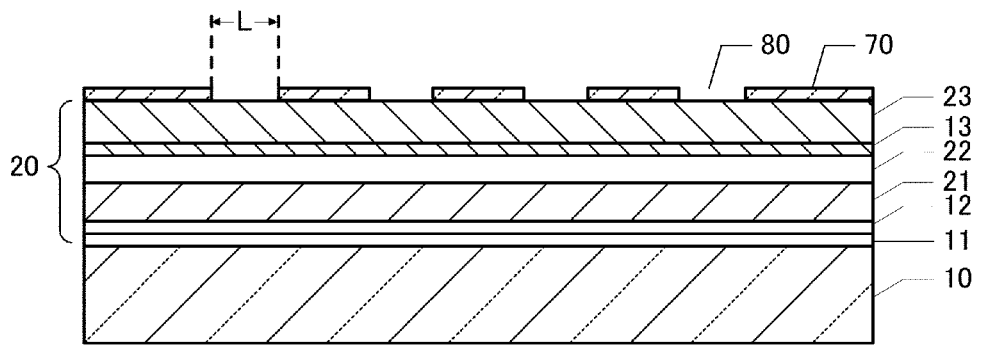

As illustrated in FIG. 2C, a mask 70 is formed on the p-type layer 23, for selective growth of protrusions of the texture 30. More particularly, the substrate is unloaded from the MOCVD system, and loaded in a thermal CVD system. A silicon oxide ($SiO_2$) film 70 is deposited on the p-type GaN layer 23 by thermal CVD, by supplying silane, oxygen and nitrogen at a substrate temperature of 400° C. Since the mask is used for crystal growth, it is sufficient if the mask is thicker than a certain value. The substrate 10 is unloaded from the thermal CVD system. A resist pattern having openings in regions corresponding to crystal growth regions is formed on the silicon oxide film, and by using the resist pattern as a mask, the silicon oxide film 70 is etched by using, for example, buffered hydrofluoric acid. The left silicon oxide film 70 is a mask for crystal growth.

Figure 2D:
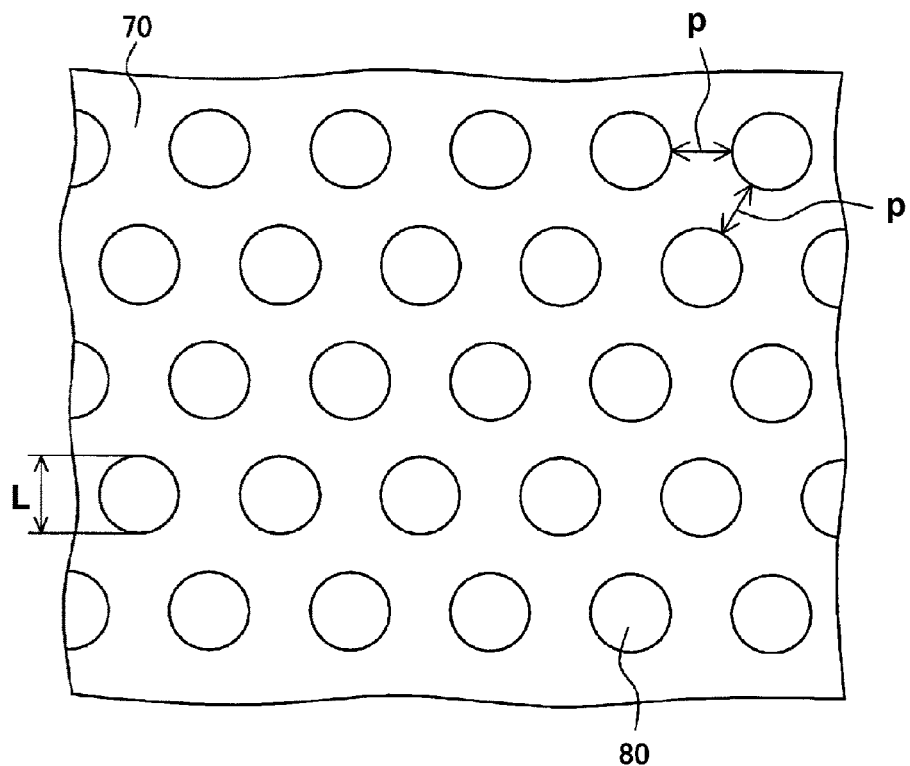

FIG. 2D is a plan view illustrating an example of the pattern of the mask 70. Circular openings 80 are located dispersively in close-packed configuration. $Al_xIn_yGa_zN$ nitride semiconductor having the crystal structure of hexagonal symmetry has a nature of crystallizing in a hexagonal shape. As crystal is grown by exposing underlying crystal in the circular openings and selecting crystal growth conditions, crystal of a six-sided pyramid shape is grown in each opening. For example, TMG of 1 mol/min to 100 mol/min and $NH_3$ of 2 LM to 10 LM are supplied as source gases. V/III ratio is set at about 500 to 445000. Ambient pressure is controlled at 500 Torr to 780 Torr, for example at about 700 Torr. The substrate temperature is set at 750 degrees centigrade to 1000 degrees centigrade, for example at about 870 degrees centigrade.

Instead of a circular opening, an opening such as a rectangular shape and a hexagonal shape aligned with crystalline axes may also be used. If a circular opening is used, it is not necessary to align the circular opening with axis directions of underlying crystal. The bottom surface of crystal grown in the circular opening is a regular hexagonal shape, and a length of each diagonal line of the regular hexagonal shape is approximately equal to the diameter L of the opening. For example, circular openings having a diameter L=3 μm are disposed in a close packed structure at a pitch p=2 μm. L is preferably 1 μm or longer. If the texture 30 is too small, a sufficient size for an emission wavelength cannot be realized.

Figure 2E:
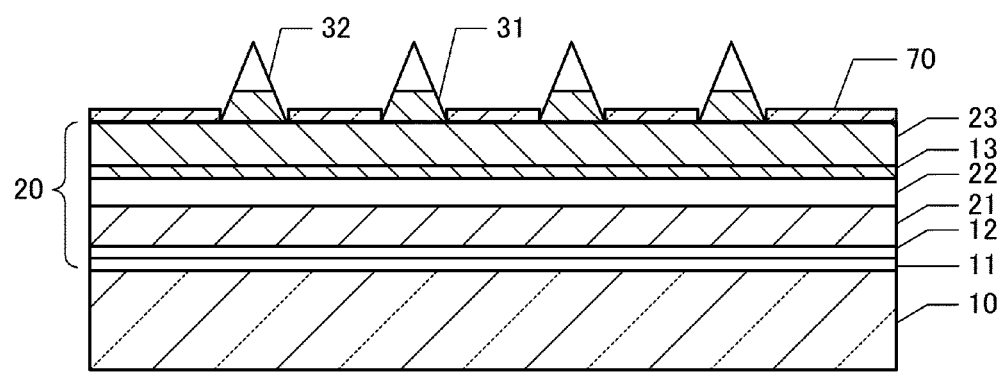

As illustrated in FIG. 2E, a crystal protrusion of the texture 30 of a three-dimensional structure is grown in each opening 80 of the mask 70. More particularly, the substrate is loaded in a MOCVD system, and an Mg-doped p-type GaN lower layer 31 having a height of about 1 μm is grown by supplying TMG: 18 μmol/min, CP2Mg: 44 sccm (sccm indicates a flow rate (cc) per minute), and $NH_3$: 4.4 LM for 4 minutes at a substrate temperature of 870° C. Next, by maintaining the substrate temperature at 870° C., a non-doped GaN upper layer 32 having a height of about 1.4 μm is grown by supplying TMG: 18 μmol/min and $NH_3$: 4.4 LM for 5 minutes. A six-sided pyramid having a height of about 2.4 μm is therefore grown. Assembly of pyramids is called the texture 30.

Figure 2F:
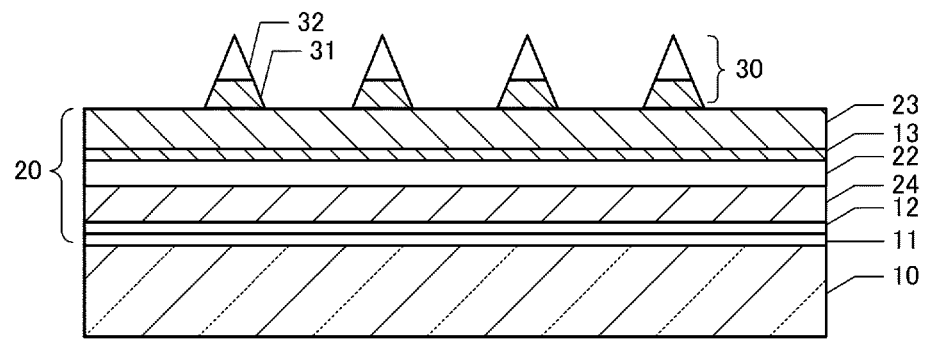

As illustrated in FIG. 2F, the substrate is unloaded from the MOCVD system, and the silicon oxide mask 70 is removed by etching with buffered hydrofluoric acid. The substrate is annealed for 3 minutes at a temperature of 850° C. in a nitrogen atmosphere to activate the doped impurities.

Figure 2G:
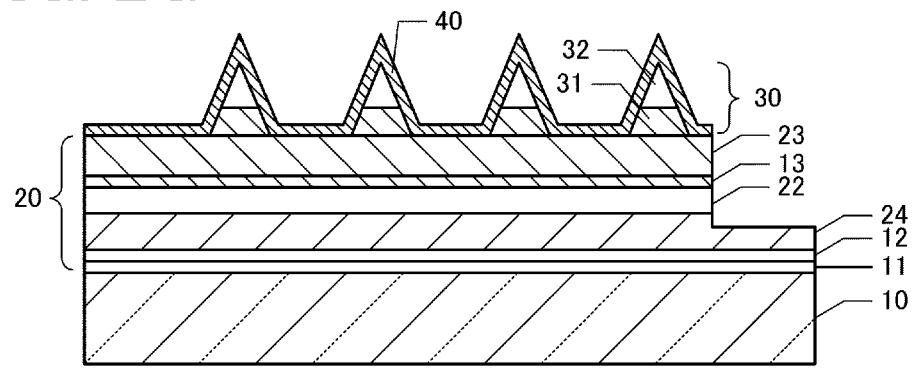

As illustrated in FIG. 2G, by using a photoresist pattern having an opening corresponding to an n-side electrode area as an etching mask, the nitride semiconductor p-type layer 23, clad layer 13 and active layer 22 are dry-etched by reactive ion etching (RIE) to expose the n-type layer 21. The resist pattern is thereafter removed with a remover. After a resist pattern covering the exposed n-type layer 21 is formed, a transparent electrode 40 of ITO covering the texture 30 and p-type layer 23 is formed by vacuum deposition or sputtering, and an unnecessary region is removed by lift-off.

Figure 2H:
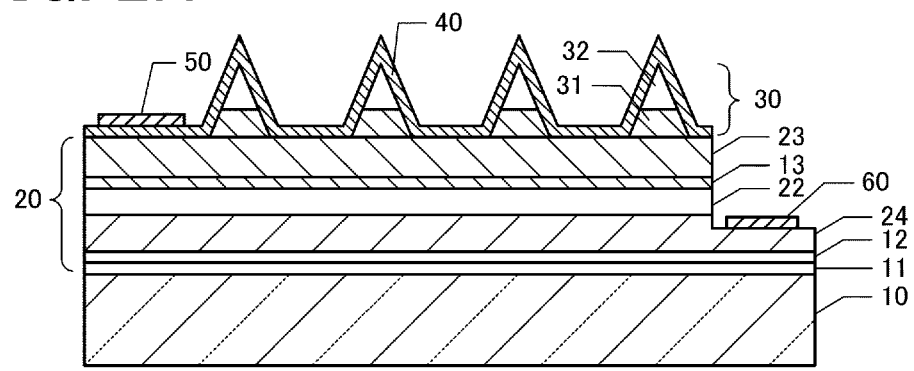

As illustrated in FIG. 2H, a p-side pad electrode 50 of TiAu is formed on a partial surface area of the transparent electrode 40. An n-side electrode 60 of TiAl is formed on the exposed n-type GaN layer 21. The p-side pad electrode and n-side electrode can be formed by lift-off. The nitride semiconductor light emitting device 101 is formed in the manner described above. If a plurality of devices are formed on a single substrate or wafer, devices are separated by braking the substrate after scribing.

Figure 3:
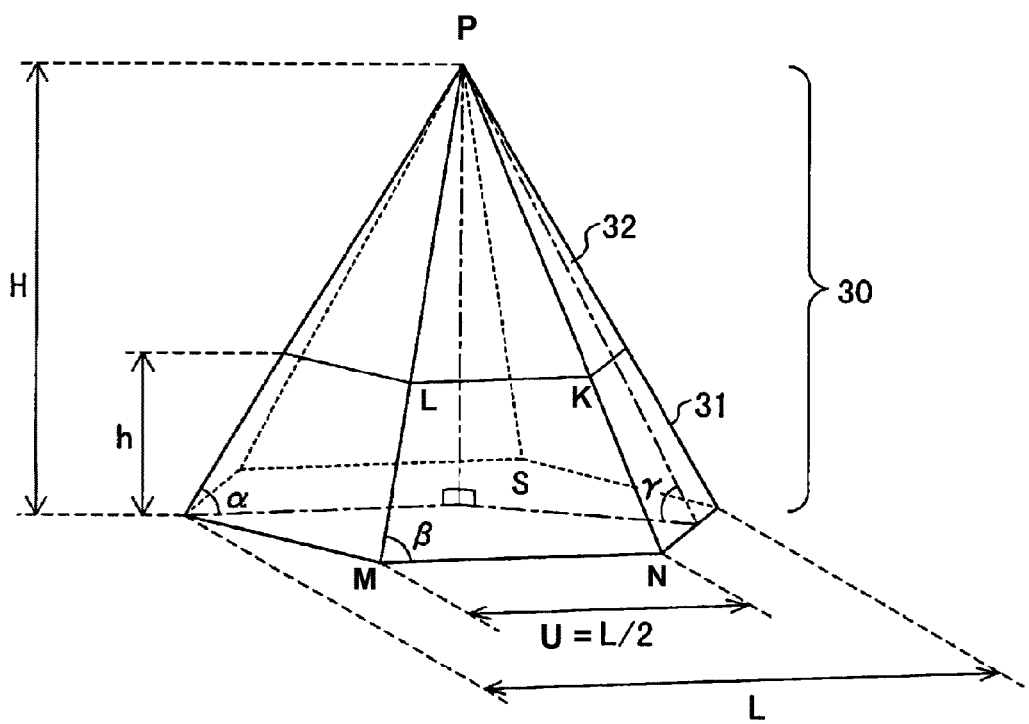
FIG. 3 is a perspective view of a protrusion of a three-dimensional texture.

FIG. 3 is an enlarged view of a six-sided pyramid of the texture 30. The lower layer 31 constitutes a current spreading region between the transparent electrode 40 and semiconductor laminate 20. It is preferable that the area Sc of the side walls of the lower layer 31 contacting the transparent electrode 40 is approximately equal to or larger than the bottom area of the six-sided pyramid of the texture 30, because a contact area becomes equal to or larger than that of the case wherein the electrode 40 is formed on the flat surface of the p-type layer 23. Representing a length of a diagonal line of the bottom surface (hexagon) of the six-sided pyramid by L, an area of the bottom surface is represented by $(3 \cdot 3^{1/2})/8 \cdot L^2$. It is preferable that the area S of the side walls of the lower layer 31 becomes equal to or larger than the area of the bottom surface of the six-sided pyramid, i.e., $$Sc \geq (3 \cdot 3^{1/2})/8 \cdot L^2 (= 0.65 \, L^2) \quad (1)$$

At L=3 μm, Sc≧5.85 μm².

Six side walls of the six-sided pyramid of the texture 30 correspond to (1-101), (10-11), (-1011), (01-11), (0-111) and (-1101) planes of a wurtzite crystal structure. An angle α between a ridge and a bottom surface of the six-sided pyramid, a bottom angle β of a side wall constituted of an isosceles triangle, and an angle γ between a side wall and a bottom surface can be estimated from a crystal structure and lattice constants. For example, if the main constituent material of the texture 30 is GaN, α≈58°, β≈75° and γ≈62°. A height H of the six-sided pyramid of the texture 30 is represented by:

$$H = (L/2) \cdot \tan \alpha \, (= 0.8 \, L) \quad (2)$$

At L=3 μm, H=2.4 μm.

A preferable height h of the lower layer 31 obtained by rearranging the equation (1) is given by:

$$h \geq 3^{1/2}/4 \cdot \tan \gamma (1 - (1 - \cos \gamma)^{1/2}) \cdot L \quad (3)$$

If the main constituent material of the texture 30 is GaN, the angles are substituted into the equations (2) and (3) (as in parentheses). A lattice constant and growth mode may change depending upon a composition, a dope amount, growth temperature and the like, and α, β, and γ may increase or decrease slightly.

A side length of a regular triangle which is ⅙ of a regular hexagon of the bottom surface of the six-sided pyramid is represented by U (=L/2). An area of the regular triangle is $S0 = (3^{1/2}/4)U^2$. An apex of the six-sided pyramid is represented by P, and a triangle of one side wall is represented by PMN. The triangle PMN has a lower side length U at the lower side MN, a height $(U/2) \tan \beta = 1.866 \, U$ and an area $S1 = (1/2) U \cdot (1.866 \, U) = 0.933 \, U^2$. Representing a triangle of each side wall formed by the upper layer 32 by PLK and a length V of a lower side LK by V=cU, an area S2 of the triangle PLK is $S2 = 0.933 \, V^2 = 0.933 \, c^2 U^2$. An area S of a trapezoid KLMN is $S = S1 - S2 = (1-c^2) \cdot 0.933 \, U^2$. A difference between the areas of the trapezoid and regular triangle is $Sc - S0 = \{(1-c^2) \cdot 0.933 - (3^{1/2}/4)\} U^2$. An area difference becomes 0 if $0.933 \, (1-c^2) = (3^{1/2}/4) = 0.433$, i.e., $(1-c^2) = 0.464$, i.e., $c^2 = 0.536$, and i.e., c=0.732. Namely, the contact areas are almost equal if an upper layer height is 0.732×(height of the six-sided pyramid) or lower and if a lower layer height is 0.268×(height of the six-sided pyramid) or higher.

Taking some margin, it is preferable that the lower layer height is 0.3×the pyramid height or higher, and more preferably the lower layer height is 0.4×the pyramid height or higher. The manufactured nitride semiconductor light emitting device has a total height of 2.4 μm and a lower layer height of 1 μm. The lower layer height is about 0.42×the total height. A total sum of a contact area between the transparent electrode 40 and the p-type layer 23 and six-sided pyramid lower layer 31 is larger than the contact area between the transparent electrode 40 and the p-type layer 23 without forming the six-sided pyramid.

Figure 4A:
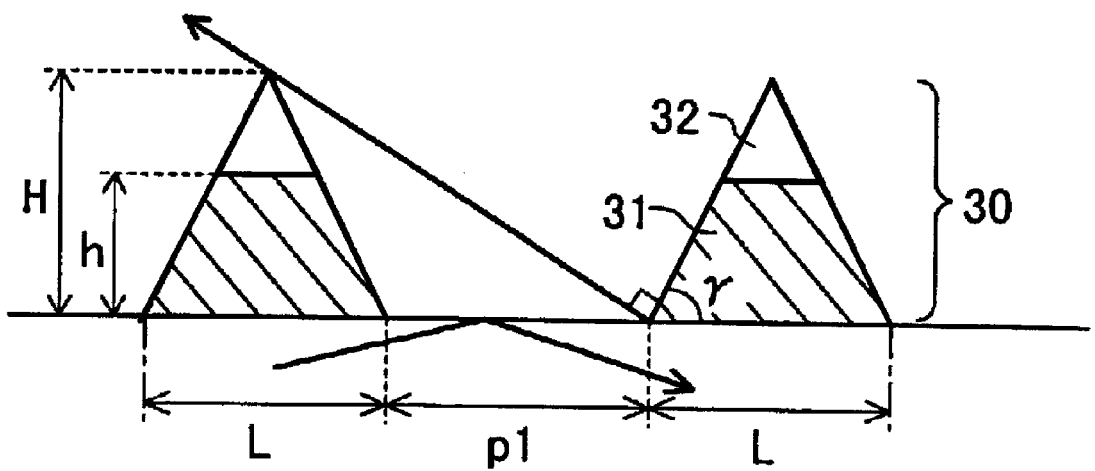
FIGS. 4A and 4B are diagrams illustrating a relation between a layout of textures and emission light.
Figure 4B:
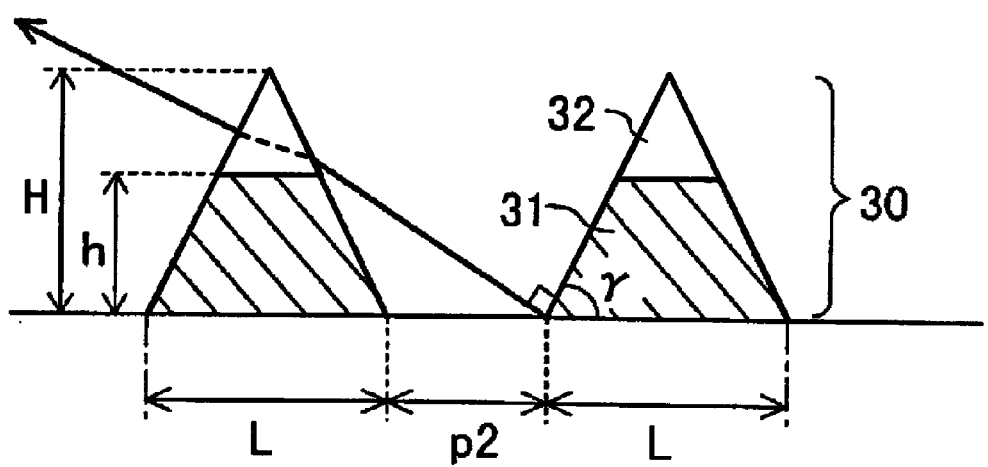

FIGS. 4A and 4B illustrate schematic cross sectional views of the texture of the texture 30 will be described. FIG. 4A illustrates a case in which light upwardly output from the surface of a six-sided pyramid of the texture 30 will not enter again an adjacent six-sided pyramid of the texture 30. In this case, loss of light which enters the texture again is small. A pitch p1 between six-sided pyramids which satisfies this condition is given by:

$$p1 > L/2 \cdot ((\tan \gamma)^2 - 1) \quad (4)$$

Since light output from a six-sided pyramid can be substantially suppressed from entering an adjacent six-sided pyramid, the height h of the lower layer 31 can be increased to a limit height. Increasing the height of the lower layer 31 to a limit height means that a contact area between the transparent electrode 40 and p-type layers 23 and 31 can be increased to a maximum value. A current supply is therefore enhanced.

If light vertically or upwardly output from the surface of a six-sided pyramid is made not at all to enter again an adjacent six-sided pyramid, the pitch p becomes large so that there is a fear that an external emission loss becomes large because of total reflection at the surface of the p-type layer 23 not covered with a six-sided pyramid of the texture 30. In order to reduce the total reflection at the surface of the p-type layer 23, six-sided pyramids of the texture 30 are preferably made dense. If six-sided pyramids of the texture 30 are too dense, lights output once from six-sided pyramids of the texture 30 enter again the lower layer 31 of another six-sided pyramid of the texture 30 so that there is a fear that the external emission efficiency is lowered by optical absorption by dopant in the lower layer.

As illustrated in FIG. 4B, six-sided pyramids of the texture 30 are disposed densely at a pitch p2 shorter than a lower limit value of the pitch p1 represented by the formula (4), where the pitch p2 is represented by:

$$p2 \leq L/2 \cdot ((\tan \gamma)^2 - 1)$$

In this case, six-sided pyramids of the texture 30 are disposed in such a manner that light will not enter again the lower layer 31 of an adjacent six-sided pyramid of the texture 30. If light enters again the lower layer 31 of another six-sided pyramid of the texture 30, external emission efficiency is lowered by optical absorption by the impurities doped therein. Since the upper layer 32 is non-doped, optical absorption by impurities does not exist in principle.

In order to ensure a contact area between the transparent electrode and p-type layer, a height h of the lower layer 31 represented by the formula (3) is retained. This condition is represented by:

$$p2 > 3^{1/2}/4 \cdot \tan \gamma (1 - (1 - \cos \gamma)^{1/2})((\tan \gamma)^2 - 1) \cdot L$$

The pitch p2 between six-sided pyramids is represented by:

$$3^{1/2}/4 \cdot \tan \gamma (1 - (1 - \cos \gamma)^{1/2})((\tan \gamma)^2 - 1) \cdot L \leq p2 \leq L/2 \cdot ((\tan \gamma)^2 - 1) \quad (5)$$

In this case, if a height h of the lower layer is in a range of:

$$3^{1/2}/4 \cdot \tan \gamma (1 - (1 - \cos \gamma)^{1/2}) \cdot L \leq h \leq p2 (\cos \gamma / \sin \gamma) / (1 - (\cos \gamma / \sin \gamma)^2) \quad (6)$$

light will not enter again the lower layer so that six-sided pyramids can be disposed densely. A condition satisfying both the formulas (5) and (6) is preferable.

Although the present invention has been described in connection with the embodiments, the present invention is not limited thereto. For example, compositions of nitride semiconductor layers may be changed in accordance with a desired emission wavelength etc.. The positions of the n-type layer 21 and p-type layer 23 may be exchanged. In this case, dopant to be doped in the lower layer 31 of the texture 30 becomes n-type, for example, S1. Further, it is obvious for those skilled in the art that various modifications, improvements, combinations and the like are possible.

What we claim are:

1. A nitride semiconductor light emitting device comprising:
    a substrate for growing nitride semiconductor of a hexagonal crystal structure;
    a first nitride semiconductor layer of a first conductivity type formed above the substrate;
    an active layer formed on the first nitride semiconductor layer for emitting light when current flows;
    a second nitride semiconductor layer of a second conductivity type opposite to the first conductivity type, formed on the active layer;
    texture formed above at least a partial area of the second nitride semiconductor layer and having a plurality of protrusions of a pyramid shape, each of the protrusions including a lower layer made of nitride semiconductor doped with impurities of the second conductivity type and an upper layer made of nitride semiconductor not intentionally doped with impurities; and
    a transparent electrode covering surfaces of the second nitride semiconductor layer and the texture.

2. The nitride semiconductor light emitting device according to claim 1, wherein said nitride semiconductor is $Al_x In_y Ga_z N (0 \leq x \leq 1, 0 \leq y \leq 1, 0 < z \leq 1, x+y+z=1)$ having a crystal structure of hexagonal symmetry.

3. The nitride semiconductor light emitting device according to claim 1, wherein said plurality of protrusions of a pyramid shape are disposed in a distributed manner on said second nitride semiconductor layer.

4. The nitride semiconductor light emitting device according to claim 3, wherein said plurality of protrusions of a pyramid shape are disposed in a distributed dispersively at a constant pitch on said second nitride semiconductor layer.

5. The nitride semiconductor light emitting device according to claim 4, wherein said plurality of protrusions of a pyramid shape are disposed in a close-packed confuguration on said second nitride semiconductor layer.

6. The nitride semiconductor light emitting device according to claim 1, wherein a height of said lower layer is 0.3× height of said protrusion or higher.

7. The nitride semiconductor light emitting device according to claim 6, wherein a height of said lower layer is 0.4× height of said protrusion or higher.

8. The nitride semiconductor light emitting device according to claim 1, wherein a relation of $Sc \geq (3 \cdot 3^{1/2})/8 \cdot L^2$ is satisfied where Sc is an area of side walls of said lower layer and L is a length of diagonal line of a hexagon constituting a bottom surface of said protrusion.

9. The nitride semiconductor light emitting device according to claim 1, wherein a pitch between said protrusions of said texture satisfies a relation of $p > L/2 \cdot ((\tan \gamma)^2 - 1)$ where $\gamma$ is an angle between a side wall and a bottom surface of said protrusion and L is a length of a diagonal line of a hexagon constituting the bottom surface.

10. The nitride semiconductor light emitting device according to claim 1, wherein:
    a pitch p between said protrusions satisfies a relation of $3^{1/2}/4 \cdot \tan \gamma (1 - (1 - \cos \gamma)^{1/2})((\tan \gamma)^2 - 1) \cdot L \leq p \leq L/2 \cdot ((\tan \gamma)^2 - 1)$ where $\gamma$ is an angle between a side wall and a bottom surface of said protrusion and L is a length of a diagonal line of a hexagon constituting the bottom surface;

a height h of said lower layer satisfies a relation of $$3^{1/2}/4 \cdot \tan \gamma (1-(1-\cos \gamma)^{1/2}) \cdot L \leq h \leq p(\cos \gamma/\sin \gamma)/(1-(\cos \gamma/\sin \gamma)^2.$$

11. A method for manufacturing a nitride semiconductor light emitting device, comprising steps of:
   a) preparing a substrate for growing nitride semiconductor of a hexagonal crystal structure;
   b) growing a first nitride semiconductor layer of a first conductivity type formed above said substrate;
   c) growing an active layer formed on said first nitride semiconductor layer for emitting light when current flows;
   d) growing a second nitride semiconductor layer of a second conductivity type opposite to the first conductivity type on said active layer;
   e) forming an inorganic insulating mask having openings for selective growth, on a surface of said second nitride semiconductor layer;
   f) growing a lower layer of a prism shape made of nitride semiconductor of the second conductivity type on said second nitride semiconductor layer exposed in the openings of said inorganic insulating mask; and
   g) growing an upper layer of a prism shape continuous with said lower layer made of nitride semiconductor intentionally not doped with impurities on said lower layer of the prism shape, said lower layer and said upper layer forming a plurality of protrusions of the prism shape.

12. The method for manufacturing a nitride semiconductor light emitting device according to claim 11, wherein said nitride semiconductor is $Al_x In_y Ga_z N$ ($0 \leq x \leq 1$, $0 \leq y \leq 1$, $0 < z \leq 1$, $x+y+z=1$) having a crystal structure of hexagonal symmetry, and said steps b), c), d), f) and g) are performed by MOCVD.

13. The method for manufacturing a nitride semiconductor light emitting device according to claim 12, wherein said step g) is performed at a same substrate temperature as a substrate temperature at said step f).

14. The method for manufacturing a nitride semiconductor light emitting device according to claim 11, wherein said openings are circular.

15. The method for manufacturing a nitride semiconductor light emitting device according to claim 14, wherein said openings are disposed dispersively.

16. The method for manufacturing a nitride semiconductor light emitting device according to claim 15, wherein said openings are disposed at a constant pitch.

17. The method for manufacturing a nitride semiconductor light emitting device according to claim 16, wherein said openings are distributed in a close-packed configuration.

18. The method for manufacturing a nitride semiconductor light emitting device according to claim 11, wherein a relation of $Sc \geq (3 \cdot 3^{1/2})/8 \cdot L^2$ is satisfied where Sc is an area of side walls of said lower layer and L is a length of diagonal line of a hexagon constituting a bottom surface of said protrusion.

19. The method for manufacturing a nitride semiconductor light emitting device according to claim 1, wherein a pitch between said protrusions of said texture satisfies a relation of $p > L/2 \cdot ((\tan \gamma)^2 - 1)$ where γ is an angle between a side wall and a bottom surface of said protrusion and L is a length of a diagonal line of a hexagon constituting the bottom surface.

20. The method for manufacturing a nitride semiconductor light emitting device according to claim 11, wherein:
   a pitch p between said protrusions satisfies a relation of $3^{1/2}/4 \cdot \tan \gamma (1-(1-\cos \gamma)^{1/2})((\tan \gamma)^2-1) \cdot L \leq p \leq L/2 \cdot ((\tan \gamma)^2-1)$ where γ is an angle between a side wall and a bottom surface of said protrusion and L is a length of a diagonal line of a hexagon constituting the bottom surface;
   a height h of said lower layer satisfies a relation of $3^{1/2}/4 \cdot \tan \gamma (1-(1-\cos \gamma)^{1/2}) \cdot L \leq h \leq p(\cos \gamma/\sin \gamma)/(1-(\cos \gamma/\sin \gamma)^2$.

* * * * *